United States Patent [19]
Yoshida

[11] 4,062,036
[45] Dec. 6, 1977

[54] JUNCTION FIELD EFFECT TRANSISTOR OF VERTICAL TYPE

[75] Inventor: Takashi Yoshida, Hamamatsu, Japan

[73] Assignee: Nippon Gakki Seizo Kabushiki Kaisha, Hamamatsu, Japan

[21] Appl. No.: 565,261

[22] Filed: Apr. 4, 1975

[30] Foreign Application Priority Data

Apr. 6, 1974  Japan ................................ 49-38471

[51] Int. Cl.² ...................... H01L 29/80; H01L 29/06
[52] U.S. Cl. ......................................... 357/22; 357/20; 357/88
[58] Field of Search ............................. 357/22, 20, 88

[56] References Cited

U.S. PATENT DOCUMENTS

| | | | |
|---|---|---|---|
| 3,409,812 | 11/1968 | Zuleeg | 357/22 |
| 3,767,982 | 10/1973 | Teszner et al. | 357/22 |
| 3,814,995 | 6/1974 | Teszner | 357/22 |

FOREIGN PATENT DOCUMENTS

| | | | |
|---|---|---|---|
| 4,841,694 | 12/1974 | Japan | 357/22 |

*Primary Examiner*—Edward J. Wojciechowicz
*Attorney, Agent, or Firm*—Cushman, Darby & Cushman

[57] ABSTRACT

A junction field effect transistor of vertical type whose gate region is formed on the drain region so as to protrude into the source region side. This gate region is formed to have a sufficiently minute dimension by relying on either the selective etching method, the selective oxidizing method, or the selective chemical vapor deposition method, whereby the area of junction can be substantially reduced, resulting in a marked decrease in junction capacitance, and a high current capability can be obtained.

8 Claims, 16 Drawing Figures

JUNCTION FIELD EFFECT TRANSISTOR OF VERTICAL TYPE

BACKGROUND OF THE INVENTION a. Field of the Invention

The present invention is concerned with a vertical-type junction field effect transistor, and more particularly, it pertains to an improved manner of forming the gate region of a vertical-type junction field effect transistor.

b. Description of the Prior Art

Of late, there has been animately progressing researches on field effect transistors exhibiting unsaturated drain voltage-drain current characteristics closely resembling those of a triode.

As a result of these research efforts, there has been recently proposed a vertical-type junction field effect transistor as shown in FIG. 1. This known field effect transistor is prepared by the steps of: selectively diffusing, for example, a highly concentrated p-type impurity into the drain region 4 made of an n-type semiconductor of a low impurity concentration on one surface thereof, to form a gate region 6 the gate region is in such a form that it is buried in said drain region 4. On top of the drain region 4 containing said gate region 6a source region is formed by chemical vapor-deposition technique. The source region 8 is composed of an n-type semiconductor of an impurity concentration not lower than that of the drain region 4. On top of the base region 6' of the gate electrode of said gate region 6 a gate electrode lead-out layer 10 is formed together with ohmic-connecting electrodes to the gate, source and drain regions, respectively, by the diffusion technique. The gate electrode lead-out layer 10 is of a low resistance.

Such a known junction field effect transistor, however, has several problems that have to be solved. More specifically, the gate region 6 is formed by diffusing, through the openings of a mask, a required impurity into the drain region 4. However, this impurity spreads in the horizontal as well as in the vertical directions. This spreading of the impurity results in an increase in the width and depth of the gate grid 6. As a result, there arise the disadvantages that the junction capacitance increases and that the upper limit of operating frequency is lowered. On the other hand, in order to highten the upper limit of operating frequency, it is necessary to sufficiently enhance the impurity concentration of the gate region 6 to thereby reduce the series resistance at the gate region. In view of the nature of the diffusion method, however, the local maximum impurity concentration of the gate region 6 tends to become markedly high when it is intended to elevate the mean impurity concentration. Therefore, crystal defect is apt to develop at the intersurface between the drain region 4 and the source region 8, especially at the sites adjacent to the gate regions 6. This development of crystal defect, in turn, increases reverse leakage and brings about a degradation of the breakdown voltage. By relying on the conventional gate constructing techniques, the gate region tends to have an excessively high impurity concentration, which, in turn therefore, results in the undesirable closing of the gate apertures due mainly to the surface diffusion of the impurity. Furthermore, the drain region 4 is formed usually by relying on the vapor deposition technique. However, there is a need that the thickness of the drain region 4 be augmented by the amount of depth of the deposited gate region 6. Thus, the time which is required for forming the drain region 4 increases in length corresponding to the augmented thickness of this region to such an extent that the development of a crystal defect might result.

SUMMARY OF THE INVENTION

It is, therefore, the primary object of the present invention to eliminate the aforesaid problems of known vertical-type junction field effect transistors, and to provide a vertical-type junction field effect transistor whose gate region is formed on top of the drain region in such a way as to protrude into the source region.

Another object of the present invention is to provide a vertical-type junction field effect transistor having a higher limit of operating frequency.

Still another object of the present invention is to provide a field effect transistor of the type described which has a high breakdown voltage.

Yet another object of the present invention is to provide a field effect transistor of the type described which has an improved drain internal resistance and an improved linearity of transfer characteristic.

Another object of the present invention is to provide a field effect transistor of the type described which has a high current capability.

A further object of the present invention is to provide a field effect transistor of the type described which is easy to manufacture.

These as well as other objects and features of the present invention will become apparent from the following detailed description.

BRIEF DESCRIPTION OF THE DRAWINGS

Like parts are given like reference numerals throughout the drawings for simplicity of explanation.

DETAILED DESCRIPTION OF THE PREFERRED EMBODIMENTS

Figure 2:
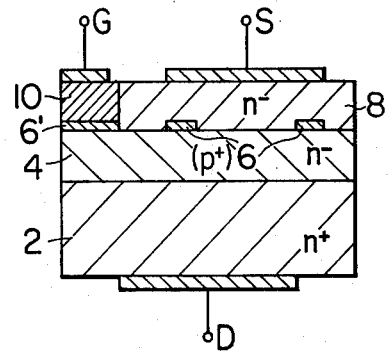
FIG. 2 is a vertical section showing an example of the vertical-type junction field effect transistor according to the present invention.

Referring now to FIG. 2, there is shown a vertical-type junction field effect transistor (hereinafter to be referred to simply as FET) according to the present invention. This FET is formed by the steps of forming on top of an n-type silicon substrate 2, by vapor deposition, an n-type drain region 4; forming on top of this drain region 4 a p-type silicon gate region 6 of a high impurity concentration; and forming, on the upper surface of the drain region 4 containing therein said gate region 6, an n-type silicon source region 8 of a impurity concentration not lower than that of the drain region 4. A gate electrode G is ohmic-connected to the gate region 6 via a gate electrode lead-out layer 10 which is formed in a source region 8 by relying on the diffusion technique. On the other hand, a source electrode S and a drain electrode D are ohmic-connected to the upper surface of the source region 8 and to the lower surface of the n-type silicon substrate 2, respectively.

The vertical-type junction FET shown in FIG. 2 is obtained by the manufacturing steps shown in FIG. 3 and 4.

Description will hereunder be made on the manufacturing process of FIG. 3. As shown in FIG. 3(a). a p-type silicon layer 6 of a high impurity concentration which eventually is used as the gate region is formed on the entire upper surface of the drain region 4, by the chemical vapor deposition technique. A non-oxidazable insulating film 9, such as $Si_3N_4$, is formed on the entire upper surface of said layer 6. This layer 6 may be formed alternatively by the diffusion technique.

Figure 3A:
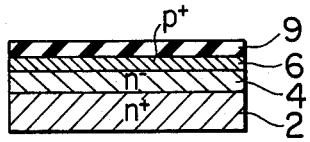
FIGS. 3a–3e shows an example of the main steps of manufacture of the field effect transistor of FIG. 2.
Figure 3B:
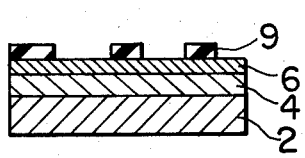

Then, as shown in FIG. 3(b), this $Si_3N_4$ film 9 is subjected to etching into a desired pattern such as mesh type, honeycomb or stagger shape. The final shape of the gate region 6 is determined in accordance with the selected pattern of the $Si_3N_4$ film 9.

Figure 3C:
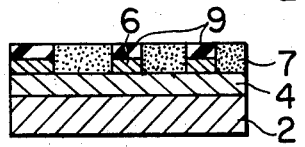

Thereafter, as shown in FIG. 3(c), the p-type silicon layer 6 is subjected to selective oxidization, using this $Si_3N_4$ film 9 which has been formed into a specific pattern as the mask.

Figure 3D:
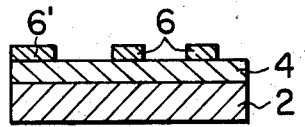

Subsequently, the $Si_3N_4$ film 9 and that oxidized-portion 7 of the gate region 6, i.e. the portion of the p-type silicon layer 6 which is not covered by the $Si_3N_4$ film 9, are removed, to form a gate region 6 of either a stagger shape, a mesh shape or a honeycomb shape, in such a form that this gate region 6 projects from the upper surface of the drain region, as shown in FIG. 3(d).

Figure 3E:
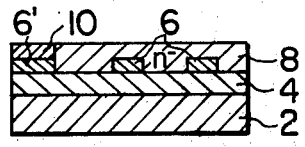

Next, as shown in FIG. 3(e), an n-type silicon source region 8 of an impurity concentration not lower than that of the drain region 4 is vapor-deposited on top of the drain region 4 so as to cover the gate region 6. Then, a p-type impurity of a high concentration is diffused into the source region 8 on a specific portion of the gate region 6 to form a lead-out layer 10 for a gate electrode G.

Figure 4A:
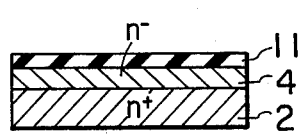
FIGS. 4a–4e shows another example of the main steps of manufacture of the field effect transistor of FIG. 2.
Figure 4B:
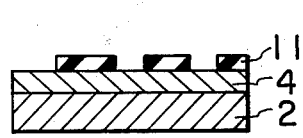

Hereunder will be described the manufacturing process of FIG. 4. As shown in FIG. 4(a), an insulating oxide film 11, such as $SiO_2$ film, is formed on the entire upper surface of the drain region 4. This $SiO_2$ film 11 is then subjected to etching into a pattern which is the reverse of the final pattern of the gate region 6 which will be made later, that is to say, the complimentary pattern, as shown in FIG. 4(b).

Figure 4C:
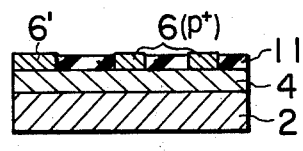

Thereafter, as shown in FIG. 4(c), a p-type silicon gate region 6 of a high impurity concentration is formed by relying on the vapor deposition method by using the aforesaid $SiO_2$ film 11 as the mask.

Figure 4D:
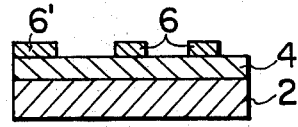

Next, the $SiO_2$ film 11 is removed by, for example, the known chemical etching technique. Thus, as shown in FIG. 4(d) there is formed a gate region 6 of the required pattern on top of drain region 4 to project therefrom.

Figure 4E:
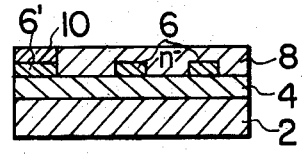

The subsequent step shown in FIG. 4(e) is similar to the step of FIG. 3(e) of the preceding example.

As stated above, in the vertical-type junction FET of the present invention shown in FIG. 2, the gate region 6 is formed on top of the drain region 4 so as to protrude into the source region 8 side. For this reason, it is possible to form the gate region 6 by relying on the steps shown in either FIG. 3 or FIG. 4. More specifically, the gate region 6 can be formed into any desired pattern by either vapor deposition through the openings of mask (FIG. 4), or by, for example, selectively oxidizing a highly doped semiconductor layer which has been formed on the entire upper surface of the drain region 4 by vapor deposition or diffusion method (FIG. 3). Unlike the known gate region which is conventionally produced by deposition and diffusion, the width of the gate region 6 which is formed according to the present invention will never spread beyond the dimension of the apertures of the mask. Accordingly, by performing the step of FIG. 3(b) or FIG. 4(b) by relying on, for example, the plasma etching method or the etching method, there is obtained with good reproducibility a gate region 6 having a width of less than 5 $\mu$m. At present, it is possible to process a mask so that its aperture has a width of up to the order of 2-3 $\mu$m. However, in case the deposition and diffusion method is used, the gate region 6 tends to spread to several micrometers beyond the edges of the aperture. In addition, it is difficult to control this excessive spreading of the p-type impurity which constitutes the gate region 6. Thus, according to the conventional gate constructing technique, it has been difficult to obtain, with good reproducibility, a gate region 6 having a width of less then 5 $\mu$m.

As discussed above, according to the present invention, it is possible to form the gate region 6 into an extremely minute dimension. Therefore, it is possible to remarkably reduce the gate junction capacitance which is one of the causes of lowering the upper limit of operating frequency, and also it is possible to enhance the utility of the chip area of the semiconductor body.

In order to raise this upper limit of operating frequency, on the other hand, it is effective to sufficiently elevate the impurity concentration of the gate region 6 to reduce the resistivity of this gate region 6. In such an instance, however, if the gate is made by known diffusion methods, the surface impurity concentration of the gate region 6 becomes markedly high as compared with the mean impurity concentration of the entire gate region 6 as discussed previously. Accordingly, there will develop a crystal defect resulting from straining of lattice in the gate region i.e. at the intersurface between the drain region 4 and the source region 8, especially at the sites adjacent to the gate regions 6, bringing about reverse leakage, or increased noise, or a degradation of the breakdown voltage. In case, for example, the mean impurity density of the gate region 6 is set at $5 \times 10^{19}$ atoms/cm$^3$, the density of surface impurity of the gate region 6 will increase to a level above $1 \times 10^{20}$ atoms/cm$^3$, giving rise to the development of a substantial crystal defect. As a means of mitigating this lattice distortion caused by this straining of lattice, there has been proposed a method of compensating for said lattice straining by depositing an impurity element together with a neutral element of substitution type under such a condition that the ionic radius of atoms of said neutral element takes a value which is intermediate between the ionic radius of atoms of said impurity element and the ionic radius of atoms of silicon constituting the semiconductor body. However, in order to have this method manifest its effect, it is necessary to introduce said neutral element at a certain rate (which will be discussed later) relative to the concentration of the impurity. It should be noted, however, that diffusivity varies depending on the elements employed and that, therefore, in case two kinds of elements having different diffusivities are doped together, their distribution profiles are not the same. As a result, homogenious distribution of these types of elements can hardly be expected, and thus some lattice strain would still exist.

In good contrast to this known diffusion method of the gate region, in case the gate region 6 is formed by the vapor deposition method in the vertical-type junction FET of the present invention, it is possible to make the impurity concentration distribution of the gate region 6 even throughout the gate region. As a result, when it is intended to lower the resistivity of the gate region 6 by elevating the average impurity concentration, the peak of this concentration can be kept desirably at a moderate level. Thus, there is little fear for the development of crystal defect due to lattice strain. Since the impurity element and the neutral element can be distributed evenly throughout the gate region 6, it is easy to mitigate the occurrence of lattice strain, whereby the development of a crystal defect can be effectively prevented. In other words, the impurity concentration of the gate region 6 can be elevated to a considerable degree to enhance the upper limit of operating frequency.

The aforesaid neutral element can be selected in accordance with the type of the semiconductor body and with the type of the impurity which are employed, by giving reference to, for example, the following table.

| Group | Element | Ionic Radus of Atom |
|---|---|---|
| 3 | Aluminum | 126 pm |
| 3 | Garium | 126 |
| 3 | Boron | 88 |
| 4 | Silicon | 117 |
| 4 | Carbon | 77 |
| 4 | Tin | 140 |
| 4 | Germanium | 122 |
| 5 | Arsenic | 118 |
| 5 | Phosphorus | 110 |
| 5 | Antimony | 136 |

For instance, in case silicon is used as the semiconductor body for constituting the respective regions 4, 6 and 8, and in case boron is used as the impurity to be doped into the gate region 6, the neutral element which is most suitable is germanium. As an example, in case boron is doped in an amount $1 \times 10^{20}$ atoms/cm$^3$, a desirable effect can be obtained by introducing germanium in an amount of the order of $7-9 \times 10^{20}$ atoms/cm$^3$.

Furthermore, in the gate region 6 formed according to the known diffusion technique, the surface impurity of the gate region 6 is of a markedly high concentration as discussed previously. Accordingly, when the source region 8 is vapor-deposited, the surface impurity of the gate region 6 tends to diffuse and vaporize, and causes partial or complete closing of the channel between the grids. Not only that, this surface impurity infiltrates into the source region 8 so that the thickness of the grids becomes unnecessarily greater. Such a tendency brings about an increase in gate-source capacitance, resulting in the lowering of the upper limit of operating frequency. Also, this enlarged size of grids will give rise to an undesirable source series resistance.

In good contrast to this known technique, in the present invention, the aforesaid inconveniences can be avoided by forming the gate region 6 by relying on the vapor deposition method. Also, since the dimension of the gate region 6 can be made very small, the thickness of the source region 8 can accordingly be made as thin as possible to reduce the source-drain internal resistance and to thereby materialize the desired superior electrical characteristic of the device.

Figure 1:
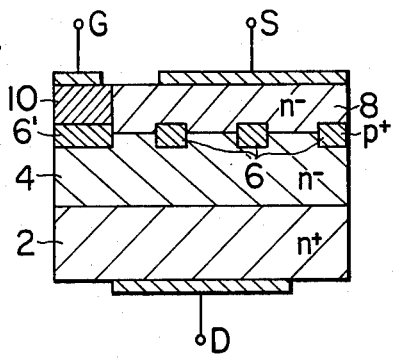
FIG. 1 is a vertical section showing an example of the known vertical-type junction field effect transistor.

Furthermore, in case the gate region 6 is formed by the vapor-deposition technique in the present invention, the thickness of the drain region 4 can be reduced by an amount corresponding to the depth of the gate region 6 deposited in the drain region 4 in FIG. 1. This means that the time required for the formation of the drain region 4 can be reduced also that, and also that the fear of the development of a crystal defect within the drain region 4 decreases. Therefore, these facts contribute to the simplification of the manufacturing steps of the improvement of electrical characteristics such as the breakdown voltage. Furthermore, conversely speaking, in case the drain region 4 has a greater thickness of the conventional device shown in FIG. 1, this means that the effective thickness of this drain region 4 is logically greater than that of the present invention shown in FIG. 2 so that the amplification factor and the breakdown voltage ca be improved.

Figure 5:
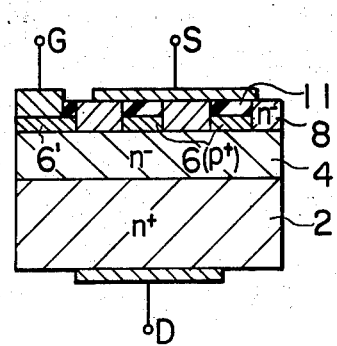
FIG. 5 is a vertical section showing a modification of the field effect transistor of the present invention.

FIG. 5 shows another embodiment of the present invention in which a layer of an insulating material 11, such as an SiO$_2$ layer or an Si$_3$N$_4$ layer, having a dielectric constant which is much smaller than that of the silicon material 8 is provided on the upper surface of the gate region 6. In order to provide this insulating layer 11, it is only necessary to have, for example, the Si$_3$N$_4$ film which serves as the etching mask in the step of FIG. 3(c) of the preceding example, left at the site where it exists.

Figure 6A:
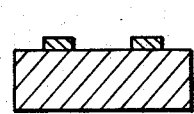
FIG. 6a is an explanatory fragmentary vertical sectional view of a semiconductor body to show the state thereof before etching.
Figure 6B:
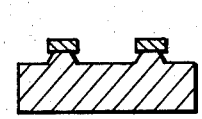
FIG. 6b is a similar view, showing the state after the semiconductor body has been etched.
Figure 7:
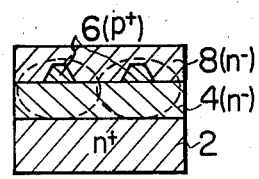
FIG. 7 is a fragmentary vertical section showing the etched or deposited gate region having a tapered profile, which is applicable to all of the examples of the present invention.

Now, the gate structure formed according to the present invention will be described hereunder in further detail. When etching of a semiconductor body is performed, it is usual that the body which has been subjected to etching shows a taper-shaped volcano-like profile as will be understood from FIG. 6(a) which is the state of the body before etching and from FIG. 6(b) which shows the state after etching. If the gate region of the FET's shown in FIGS. 2 and 5 are seen on an enlarged scale, the actual profile of the gate region is as shown in FIG. 7 in which the respective grids such have a configuration that their side surfaces parallel with the path of electric current are tapered to provide a volcano-like shape. More specifically, the gate region 6 is formed in such a way that its width or its cross sectional area will decrease as it goes closer to the upper part of the source region 8. Because of this tapered configuration of the gate region 6, it should be noted that, despite the presence of the gate region 6 on the source side, any superfluous source series resistance will never appear. The absence of the gate region 6 on the drain side greatly reduces the drain internal resistance. As a result, it is possible to manufacture a vertical-type junction FET having a triode characteristic and yet having a very low drain internal resistance. The experiments show the fact that, in case the drain region 4 is prepared with a highly pure silicon (semiconductor) of, for example 10$^{14}$ atoms/cm$^3$, a good linearity of transfer characteristics is obtained but the drain internal resistance is usually elevated. According to the present invention, however, the drain internal resistance is not elevated even in case a highly pure semiconductor is used, and yet a good linearity of transfer characteristics can be obtained. Thus, the FET embodying the present invention is suitable especially in amplifiers of audio instruments such as a stereo set.

Still another example of the present invention will be described hereunder. For example, in the respective embodiments of FIGS. 2 and 5, it is also advantageous to introduce a neutral element in the drain region 4. More specifically, the drain region 4 itself is formed on top of the silicon substrate 2 by relying on the vapor-deposition technique. It is to be noted, however, that generally speaking, the impurity concentration of the silicon substrate 2 is considerably higher than that of the drain region 4. Accordingly, there is apt to develop lattice strain between the silicon substrate 2 and the drain region 4 due to mismatching of lattice. Once this lattice strain has developed, this strain will keep growing up to the upper end of the drain region 4, frequently giving rise to a cause of reverse leakage and lowering of breakdown voltage. Accordingly, it is extremely effective for the improvement of the characteristic of the device to introduce a neutral element at the time the drain region 4 is formed by chemical vapor-deposition.

Description has been made above on instances in which the source region 8 and the drain region 4 are formed with an n-type silicon and the gate region 6 is prepared with a p-type silicon. Conversely, the source region 8 and the drain region 4 may be formed with a p-type silicon and the gate region 6 may be prepared with an n-type silicon, and furthermore, germanium may be employed as the neutral semiconductor element.

Description has been made on several embodiments of the present invention of referring to the drawings. It should be noted, however, that the present invention can take modifications in broad range so long as they do not depart from the spirit of the present invention, and that the present invention is not limited to these illustrated and discussed embodiments other than the limitation made in the appending claims.

I claim:

1. A vertical-type junction field effect transistor comprising:
    a drain region provided on a highly doped semiconductor substrate having a certain conductivity type and made of a semiconductor body having a conductivity type the same as that of said substrate and having a low impurity concentration,
    a source region formed on one surface of said drain region and made with a semicondutor body having a conductivity type the same as that of said drain region and having throughout a substantially constant impurity concentration not lower than that of the drain region, and
    a gate region provided at the intersurface between said drain region and said source region and having a conductivity type opposite to the conductivity type of said drain region and source region,
    said gate region being formed on the surface of said drain region between said drain and said source regions and protruding only into said source region.

2. A vertical-type junction field effect transistor according to claim 1, in which said substrate, said drain region, said source region and said gate region are made with silicon material.

3. A vertical-type junction field effect transistor according to claim 1, in which said gate region is formed by relying on the vapor-deposition technique.

4. A vertical-type junction field effect transistor according to claim 3, in which said formation of the gate region by relying on the vapor-deposition technique comprises the introduction of a neutral element of substitutional type together with an impurity element under such a condition that the ionic radius of atoms of said neutral element takes a value intermediate of the ionic radius of atoms of said impurity element and the ionic radius of atoms of the semiconductor material constituting the field effect transistor.

5. A vertical-type junction field effect transistor according to claim 1, wherein the cross-sectional profile of any portion of the gate region taken along a plane extending through the source, gate and drain regions has a volcano-like shape whose cross-sectional area becomes progressively smaller as it extends farther from the drain region.

6. A vertical-type junction field effect transistor according to claim 1, in which an insulating layer having a dielectric constant smaller than that of the semiconductor body of said field effect transistor is provided on the upper surface of the gate region.

7. A vertical-type junction field effect transistor according to claim 6, in which the upper surface of the source region lies in substantially the same plane with the upper surface of the insulating layer, and a gate electrode is ohmic-connected to the site of the gate region where a corresponding part of the insulating layer of said gate region has been removed.

8. A vertical-type junction field effect transistor according to claim 7, in which said substrate, said drain region, said source region and said gate region are made of silicon material.

* * * * *